United States Patent
Yokota et al.

(10) Patent No.: US 7,389,570 B2
(45) Date of Patent: Jun. 24, 2008

(54) SURFACE ACOUSTIC WAVE DEVICE MANUFACTURING METHOD, SURFACE ACOUSTIC WAVE DEVICE, AND COMMUNICATIONS EQUIPMENT

(75) Inventors: Yuuko Yokota, Soraku-gun (JP); Motoki Ito, Soraku-gun (JP); Kiyohiro Iioka, Soraku-gun (JP); Wataru Koga, Soraku-gun (JP); Shigehiko Nagamine, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 127 days.

(21) Appl. No.: 11/169,141

(22) Filed: Jun. 27, 2005

(65) Prior Publication Data

US 2005/0285475 A1 Dec. 29, 2005

(30) Foreign Application Priority Data

Jun. 28, 2004 (JP) ............................. 2004-190564
Sep. 15, 2004 (JP) ............................. 2004-268257

(51) Int. Cl.
*H03H 3/08* (2006.01)
(52) U.S. Cl. ..................... 29/25.35; 29/832; 29/841; 29/846; 333/193
(58) Field of Classification Search ............. 333/193, 333/150; 29/25.35
See application file for complete search history.

(56) References Cited

U.S. PATENT DOCUMENTS 5,325,573 A * 7/1994 Miyashita et al. ......... 29/25.35
5,773,917 A 6/1998 Satoh et al.
6,297,580 B1 10/2001 Takayama et al.
6,750,592 B2 * 6/2004 Takahashi et al. ........ 310/313 D
2004/0207485 A1 * 10/2004 Kawachi et al. ............ 333/133
2004/0245891 A1 * 12/2004 Kawachi et al.

FOREIGN PATENT DOCUMENTS

| CN | 1499717 A | | 5/2004 | |
|---|---|---|---|---|
| JP | 54-146990 | * | 11/1979 | ............. 29/25.35 |
| JP | 58-13009 | * | 1/1983 | ............. 333/150 |
| JP | 04-293310 | | 10/1992 | |
| JP | 4-313906 | | 11/1992 | |
| JP | 6-303073 | * | 10/1994 | |
| JP | 7-122961 | | 5/1995 | |
| JP | WO99/54995 | | 10/1999 | |
| JP | 2004153580 A | | 5/2004 | |
| JP | 2004235908 A | | 8/2004 | |

OTHER PUBLICATIONS

Akinori Miyamoto, et al., "Novel Optical Observation Technique for shear Horizontal Wave in SAW Resonators on 42 YX-cut Lithium Tantalate"; 2002 IEEE Ultrasonics Symposium-89.

* cited by examiner

*Primary Examiner*—Barbara Summons
(74) *Attorney, Agent, or Firm*—Hogan & Hartson LLP

(57) ABSTRACT

After electrode patterning on an electrode forming surface of a piezoelectric substrate 2 (FIG. 1(*b*)), a conductor layer is formed on an electrode non-forming surface of the piezoelectric substrate 2 (FIG. 1(*c*)). After forming the conductor layer, the conductor layer formed on the other surface is removed (FIG. 1(*f*)) after at least one step (FIG. 1(*e*)), and thereafter, dicing for separation into elements and mounting on a mounting substrate are carried out. By removing all the conductor layer on the other surface of the piezoelectric substrate, the out-of-passband attenuation and isolation performance can be significantly improved.

16 Claims, 12 Drawing Sheets

※MNW: MATCHING NETWORK

※MNW: MATCHING NETWORK

1500

400

220

SURFACE ACOUSTIC WAVE DEVICE MANUFACTURING METHOD, SURFACE ACOUSTIC WAVE DEVICE, AND COMMUNICATIONS EQUIPMENT

BACKGROUND OF THE INVENTION

1. Field of the Invention

The present invention relates to a surface acoustic wave device manufacturing method to be used for surface acoustic wave filters, a surface acoustic wave device manufactured thereby, and a communications equipment.

2. Description of Related Art

Recently, surface acoustic wave filters are increasingly used in various communications equipments.

According to higher frequencies and higher functions of communications equipments, it has been increasingly demanded to increase attenuation out of the bands of the surface acoustic wave filters.

FIG. 13 shows a schematic sectional view of a face-down mounting structure of a conventional surface acoustic wave device.

In FIG. 13, the reference numeral 51 denotes a piezoelectric substrate, 52 denotes a ground pad, 53 denotes a comb-shaped IDT (Inter Digital Transducer) electrode (referred to as IDT electrode) formed on the piezoelectric substrate 51, 54 denotes a conductive pattern formed on a package (mounting substrate) 57, 55 denotes a bump for connection, and 59 denotes a conductor layer formed on the back face (opposite to the surface with the IDT electrode formed) of the piezoelectric substrate 51.

In the construction of this figure, the ground pad 52 and the IDT electrode 53 are formed of, for example, Al—Cu films, and the conductive pattern 54 and the ground pad 52 are electrically connected by the bump 55 made of, for example, Au. Furthermore, by seam-welding a lid 56 via a joint layer 58, the package 57 is sealed and the airtightness of the inside housing the surface acoustic wave element is maintained.

Main causes of deterioration in out-of-band attenuation in a surface acoustic wave device with such a conventional face-down structure are, for example, increases in electrical resistance, parasitic inductances, and electromagnetic coupling between the input and output due to floating capacitances at the ground pad 52 and the IDT electrode 53 of the surface acoustic wave element, the conductive pattern 54 of the package 57, and so on.

Particularly, electromagnetic coupling between the input and the output due to floating capacitances is described.

The surface acoustic wave element is an element using a comb-shaped IDT electrode formed on a piezoelectric substrate. Normally, the piezoelectric substance shows pyroelectricity due to extreme temperature change, so that if a process involving extreme temperature change is applied during manufacturing an element having an IDT electrode on a piezoelectric substrate, spark occurs between the electrodes of the IDT electrode and breaks the element. Therefore, in order to prevent charge accumulation on the piezoelectric substrate as much as possible, a conductor layer 59 is generally formed on the entire back face of the piezoelectric substrate.

This conductor layer 59 is effective for preventing pyroelectric break-down while manufacturing the element, however, the inventors found that a capacity coupling occurs between the conductor layer 59 and the input/output electrodes of the IDT electrode 53, which deteriorates the out-of-band attenuation.

Particularly, among various surface acoustic wave devices, a duplexer that separates a signal with a transmitting side band (for example, low-frequency side band) and a signal with a receiving side band (for example, high-frequency side band) from each other is described in detail.

This duplexer is referred to as a surface acoustic wave duplexer (hereinafter, abbreviated to SAW-DPX).

In the SAW-DPX, a transmitting side band filter (hereinafter, referred to as a transmitting side filter) and a receiving side band filter (hereinafter, referred to as a receiving side filter) are formed on the same surface of the same piezoelectric substrate to realize downsizing.

However, in actuality, if the transmitting side filter and the receiving side filter are formed on the same piezoelectric substrate, isolation performance between these filters cannot satisfy the required specifications of communications terminals.

The isolation performance means the level of a signal leakage from one filter to the other filter, and such signal leakage must be minimized.

Particularly, in a duplexer, if a transmission signal with a great power amplified on the transmitting side leaks from the transmitting side filter to the receiving side filter and leaks to the receiving side, it becomes impossible to receive a receiving signal the power level of which is originally low.

Therefore, the specifications of isolation performance required for a duplexer require minimization of signal leak, and this demand remarkably increases more than in the specifications required for interstage Dual-SAW filters.

It is considered that one of the causes of deterioration in isolation performance between the filters is elastic wave leak. Particularly, in a SAW-DPX, an elastic wave excited in the IDT electrode that forms the transmitting side filter cannot be sufficiently shut in the IDT electrode, and an elastic wave that has leaked from the IDT electrode of the transmitting side filter propagates through the surface of the piezoelectric substrate, and this is received by the IDT electrode forming the receiving side filter, resulting in leak of the signal from the transmitting side filter to the receiving side filter and deterioration in isolation performance (Akinori Miyamoto, Shin-ichi Wakana, and Akio Ito, Fujitsu Laboratories Limited, "Novel optical observation technique for shear horizontal wave in SAW resonators on 42° YX-cut lithium tantalate" 2002 IEEE ULTRASONICS SYMPOSIUM-89).

In detail, it has been considered that the elastic surface wave propagation path of the IDT electrode of the transmitting side filter and the elastic surface wave propagation path of the IDT electrode of the receiving side filter are overlapped with each other on the same straight line, so that an elastic surface wave leaks from the IDT electrode of the transmitting side filter to the IDT electrode of the receiving side filter, resulting in deterioration in isolation performance.

Therefore, there has been an attempt to improve the isolation performance by shutting-off the propagation of the leak of the elastic surface wave by forming the transmitting side filter and the receiving side filter that had been formed on the same piezoelectric substrate, on separate piezoelectric substrates so as to be separated from each other.

Although, this attempt improves the isolation performance, since the transmitting side filter and the receiving side filter which had been formed originally integrally are formed separately on separate piezoelectric substrates, when the transmitting side filter and the receiving side filter are mounted on a mounting substrate, the area occupied by a region serving as a duplexer becomes larger than in the case where the transmitting side filter and the receiving side filter are integrally formed on the same piezoelectric substrate, and this cannot meet the demand for downsizing.

Therefore, it is also possible that the IDT electrodes of the transmitting side filter and the receiving side filter are arranged so that their elastic surface wave propagation paths are not overlapped with each other, that is, for example, the elastic surface wave propagation paths of the IDT electrodes are made parallel to each other. A small-sized SAW-DPX having improved isolation performance should be obtained while realizing downsizing by forming the transmitting side filter and the receiving side filter on the same piezoelectric substrate without separately forming these on separate piezoelectric substrates.

However, the isolation performance was not improved in a detailed experiment carried out by the present inventor. This means that the cause of deterioration in isolation performance is not only the elastic surface wave leak.

The present inventor found that the back face conductor layer 59 was harmful to the isolation performance of the surface acoustic wave element although it was effective for preventing pyroelectric break-down during a process of manufacturing the element.

An object of the invention is to provide a highly reliable surface acoustic wave device that can improve the out-of-band attenuation of filters, and a communications equipment using the same.

More specifically, an object of the invention is to provide a small-sized surface acoustic wave device with excellent isolation performance in which a transmitting side filter and a receiving side filter are formed on the same piezoelectric substrate without forming these on separate piezoelectric substrates, and a communications equipment using the same.

SUMMARY OF THE INVENTION

A surface acoustic wave device manufacturing method of the invention comprises an electrode layer forming step for forming an electrode layer on a main surface (IDT electrode forming surface) of a piezoelectric substrate, an electrode patterning step for forming a filter region including an IDT (Inter Digital Transducer) electrode, an input electrode part, and an output electrode part by patterning the electrode layer on the main surface, a step for carrying out either one step first and the other step later of a separating step for separating the piezoelectric substrate to obtain a number of surface acoustic wave elements and a mounting step for mounting the surface acoustic wave element on a mounting substrate by making the main surface of the piezoelectric substrate face the substrate, and further comprises, (i) before the electrode layer forming step, (ii) between the electrode layer forming step and the electrode patterning step, or (iii) between the electrode patterning step and the separating step or mounting step, a conductor layer forming step for forming a conductor layer on the other surface of the piezoelectric substrate, and after the conductor layer forming step, a conductor layer removing step for removing the conductor layer formed on the other surface after at least one step.

According to this surface acoustic wave device manufacturing method of the invention, no conductor layer is formed on the other surface of the surface acoustic wave element of the completed surface acoustic wave device. Therefore, even when flip-chip mounting is carried out by making the main surface of the piezoelectric substrate face the upper surface of the mounting substrate, the input electrode part and the output electrode part in the filter region are not capacity-coupled via the conductor layer on the other surface of the piezoelectric substrate, so that a small-sized surface acoustic wave device that does not deteriorate the out-of-passband attenuation can be manufactured.

Particularly, according to recent demands for reduction in size and height of parts, for the surface acoustic wave device, it has been demanded that the thickness of the piezoelectric substrate is made thinner, however, the capacity between the electrodes on the main surface of the piezoelectric substrate and the conductor layer on the other surface increases as the piezoelectric substrate becomes thinner, and therefore, deterioration in out-of-passband attenuation caused by capacity coupling through parasitic capacitance increases further. As a measure for this, by removing all of the conductor layer on the other surface, a surface acoustic wave device which is thin and has excellent out-of-passband attenuation is realized.

By carrying out the step for removing the conductor layer formed on the other surface after any one of the electrode layer forming step, the electrode patterning step, the mounting step, and the separating step, pyroelectric break-down due to heat applied to the piezoelectric substrate can be prevented. Namely, in the electrode layer forming step and the electrode patterning step, the substrate surface is exposed to plasmas during film formation by RIE, sputtering, and CVD, and the temperature of the substrate rises. In the mounting step, the temperature of the substrate increases at the time of temporary connection of the bump by heating and ultrasonic waves and real connection by solder fusing. In the separating step, the substrate temperature rises when laser-cutting.

In addition, the surface acoustic wave device manufacturing method of the invention is allowed to include a step for forming a protective film for protecting the IDT electrode and a step for forming an electrode pad for connecting the surface acoustic wave element and the mounting substrate.

In this case, by carrying out the step for removing the conductor layer formed on the other surface after either one step of the protective film forming step or the electrode pad forming step, piezoelectric break-down due to heat applied to the piezoelectric substrate during these steps can be prevented.

An annular electrode surrounding the filter region is formed on the main surface of the piezoelectric substrate, and in the mounting step, when the annular electrode is joined to a mounting substrate side annular conductor formed on the mounting substrate, the surface acoustic wave element can be firmly mounted on the mounting substrate while sealing airtight the IDT electrode, the input electrode part, and the output electrode part, and therefore, when removing the conductor layer on the other surface, the conductor layer can be removed without damaging the IDT electrode formed on the main surface of the piezoelectric substrate.

In addition, when the IDT electrodes are electrically connected to the annular electrode via a resistor, and the annular electrode is at a ground potential, the IDT electrodes are grounded in a direct current manner, so that pyroelectric break-down can be more securely prevented. Therefore, even when the conductor layer on the other surface of the piezoelectric substrate is removed before the step involving heat application to the piezoelectric substrate, pyroelectric breakdown in this step can be sufficiently prevented.

Furthermore, the surface acoustic wave device of the invention is also applicable to a duplexer having a transmitting side filter region and a receiving side filter region formed on the main surface.

Deterioration in isolation performance in the duplexer is caused by capacity coupling between the input electrode of the transmitting side filter and the output electrode of the receiving side filter formed on the main surface of the piezoelectric substrate via the back face conductor layer that are formed on the entirety of the other surface of the piezoelectric substrate in normal cases.

Effects in the case where the invention is applied to a duplexer are described by using a conception diagram of the circuit used for simulation and simulation results.

FIG. 7(a) is a circuit diagram of a communications equipment containing no parasitic capacitance, FIG. 7(b) is a diagram showing an example of isolation performance, and FIG. 7(c) is a circuit diagram of a communications equipment containing a parasitic capacitance C caused by the back face conductor, and FIG. 7(d) is a diagram showing an example of isolation performance.

The parasitic capacitance C shown in FIG. 7(c) is present between the input electrode part of the transmitting side filter and the output electrode part of the receiving side filter, which is a very small parasitic capacitance of approximately 50 fF (femto=$10^{-15}$).

From the results shown in FIG. 7(b) and FIG. 7(d), it is understood that the isolation performance is deteriorated only by the presence of such a very small parasitic capacitance C. Namely, as understood by comparing FIG. 7(b) and FIG. 7(d), the signal intensity at 869 MHz through 894 MHz is −30 dB through −40 dB as shown in FIG. 7(d) in such a case where the parasitic capacitance C is present, however, in a case where no parasitic capacitance is present, as shown in FIG. 7(b), the signal intensity becomes equal to or less than −50 dB, and the isolation performance is greatly improved due to no presence of the parasitic capacitance.

When the piezoelectric substrate is formed of, for example, a lithium tantalate single crystal substrate with a thickness of 250 micrometers and calculation is carried out by setting a relative permittivity to 42.7, such a parasitic capacitance of approximately 50 fF is equivalent to a capacitance formed when square electrodes, 180 micrometers on a side, are formed opposite each other on the surface and back surface of the piezoelectric substrate. Normally, the areas of the input and output electrode parts of the surface acoustic wave filters are at this degree, so that it can be said that the value inserted as the parasitic capacitance C in the simulation properly reflects the actuality.

The isolation performance is most influenced by the parasitic capacitance C described herein between the input electrode part of the transmitting side filter and the output electrode part of the receiving side filter, however, a parasitic capacitance is also present between a connecting electrode that connects the IDT electrode of each filter and the input and output electrode parts of each filter, and a parasitic capacitance is also present between a connecting electrode that connects the IDT electrode of one filter and a connecting electrode that connects the IDT electrode of the other filter. These parasitic capacitances also deteriorate the isolation performance.

Therefore, according to the invention, particularly, the isolation performance between the transmitting side filter and the receiving side filter is improved, whereby the transmitting side filter (for example, a low-frequency side filter) and the receiving side filter (for example, a high-frequency side filter) can be integrally formed on the same piezoelectric substrate.

Therefore, a SAW-DPX smaller than one including a transmitting side filter and a receiving side filter formed on separate piezoelectric substrates can be manufactured. Even when mounting (flip-chip mounting) is carried out in that the main surface (IDT electrode forming surface) of the piezoelectric substrate is made to face the upper surface of the mounting substrate, the input electrode of the transmitting side filter and the output electrode of the receiving side filter are not capacity-coupled to each other via a conductor layer on the other surface, so that a surface acoustic wave device which does not deteriorate the isolation performance although it is a small-sized SAW-DPX is obtained, and pyroelectric break-down of the surface acoustic wave element in the manufacturing step can be prevented.

Furthermore, according to the invention, it is preferable that an annular electrode surrounding the transmitting side filter region and the receiving side filter region is formed on the main surface of the piezoelectric substrate, and in the mounting step, the annular electrode is joined to a mounting substrate side annular conductor formed on the mounting substrate.

By joining these annular electrode and mounting substrate side annular conductor, the surface acoustic wave element can be firmly mounted on the mounting substrate while the IDT electrode, the input electrode part, and the output electrode part are sealed airtight, so that when the conductor layer on the other surface is removed after mounting, it is removed without damaging the IDT electrode formed on the main surface of the piezoelectric substrate.

It does not matter in which way the annular electrode is shaped so as to individually surround the transmitting side filter and the receiving side filter or collectively surround these.

The surface acoustic wave device of the invention is manufactured by any one of the methods of the invention. The surface acoustic wave device of the invention is preferably applied to a SAW-DPX since surface acoustic wave filters having excellent isolation performance are obtained while reducing the size and thickness.

A communications equipment of the invention uses the surface acoustic wave device of the invention in a transmission circuit or a receiving circuit. Therefore, since the surface acoustic wave device is small in size although it has excellent out-of-passband attenuation, a wider mounting area can be secured for other parts, and this realizes a high-performance communications equipment.

Particularly, by using the surface acoustic wave device of the invention as a duplexer, since the duplexer becomes small in size while it has excellent isolation performance, a wider mounting area can be secured for other parts, whereby a high-performance communications equipment is realized.

The above-mentioned or other advantages, features, and effects of the invention will be clarified by the description of embodiments given below with reference to the accompanying drawings.

DETAILED DESCRIPTION OF THE PREFERRED EMBODIMENTS

Surface Acoustic Wave Element

Figure 3:
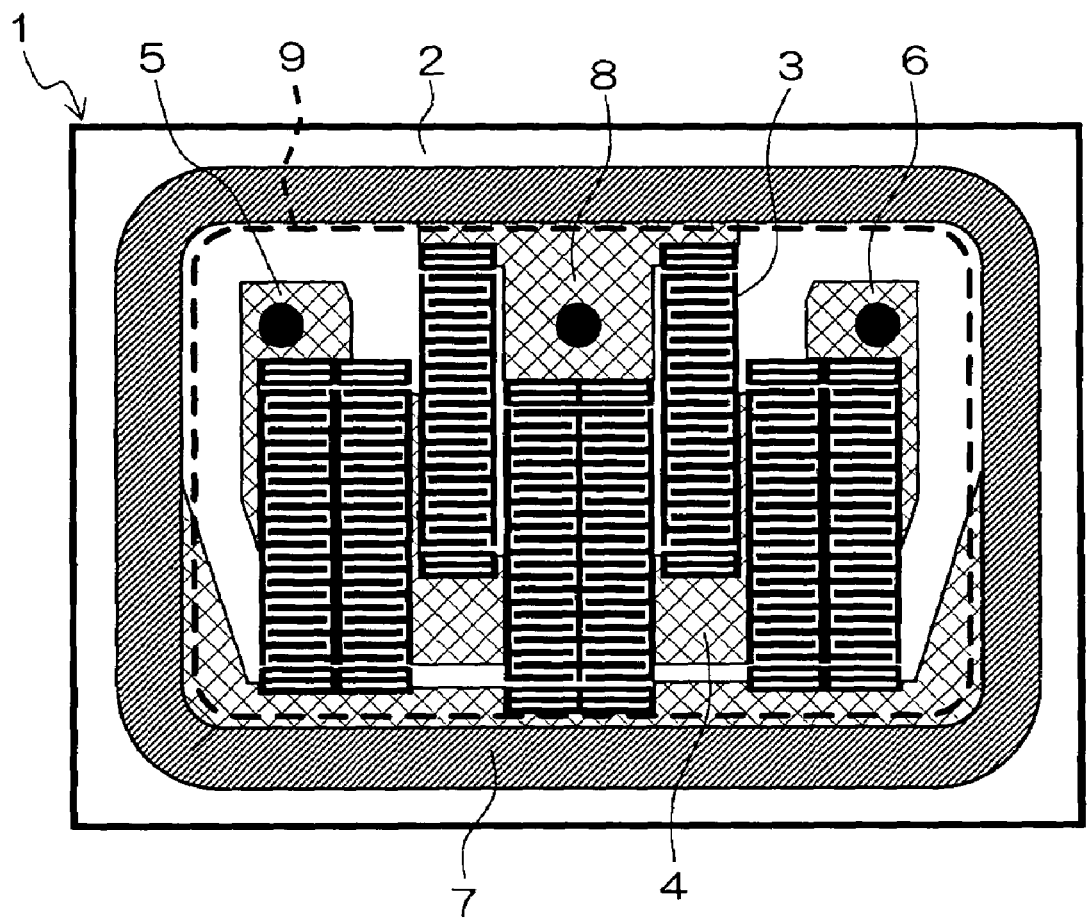
FIG. 3 is a plan view showing the main surface of a surface acoustic wave element manufactured according to the invention.

FIG. 3 is a plan view showing the main surface of a piezoelectric substrate on which a surface acoustic wave element is formed.

As shown in FIG. 3, on an IDT electrode forming surface (referred to as a main surface) of the piezoelectric substrate 2, a filter region 9 is formed. In the filter region 9, a plurality of IDT electrodes 3 forming ladder-type filters, a connecting electrode 4 connecting these IDT electrodes, and an input electrode part 5 and an output electrode part 6 electrically connected to the IDT electrodes 3 for connecting the surface acoustic wave element 1 and a mounting substrate (not shown) are formed.

The reference numeral 7 denotes a quadrilateral frame-shaped annular electrode formed so as to surround the IDT electrodes 3, the connecting electrode 4, the input and output electrode parts 5 and 6, and a ground electrode 8 (hereinafter, these are referred to as "IDT electrodes and so on"). The reference numeral 8 denotes a ground electrode. The ground electrode 8 is connected to the annular electrode 7.

The annular electrode 7 is connected to a mounting substrate side annular conductor of the mounting substrate by using solder or the like, and serves as a ground electrode of a surface acoustic wave filter, and has a role of sealing the space between the piezoelectric substrate 2 and the mounting substrate.

In this surface acoustic wave element 1, no conductor layer is formed on the surface (referred to as the other surface) opposite the main surface with the IDT electrodes and so on formed of the piezoelectric substrate 2. Thereby, capacitive coupling between the input electrode part 5 of the filter region 9 and the output electrode part 6 of the filter region 9 via a parasitic capacitance occurring between the same and the conductor layer can be prevented, whereby the out-of-passband attenuation performance of the surface acoustic wave element 1 is improved.

In this example, the annular electrode 7 is used as a ground electrode of the surface acoustic wave element 1, however, it is also possible that the ground electrode 8 of the surface acoustic wave element 1 is directly connected to the ground electrode of the mounting substrate without using the annular electrode 7 as a ground electrode.

By carrying out mounting by making the above-described main surface of the piezoelectric substrate 2 face the upper surface of the mounting substrate, a surface acoustic wave device is formed.

Figure 4:
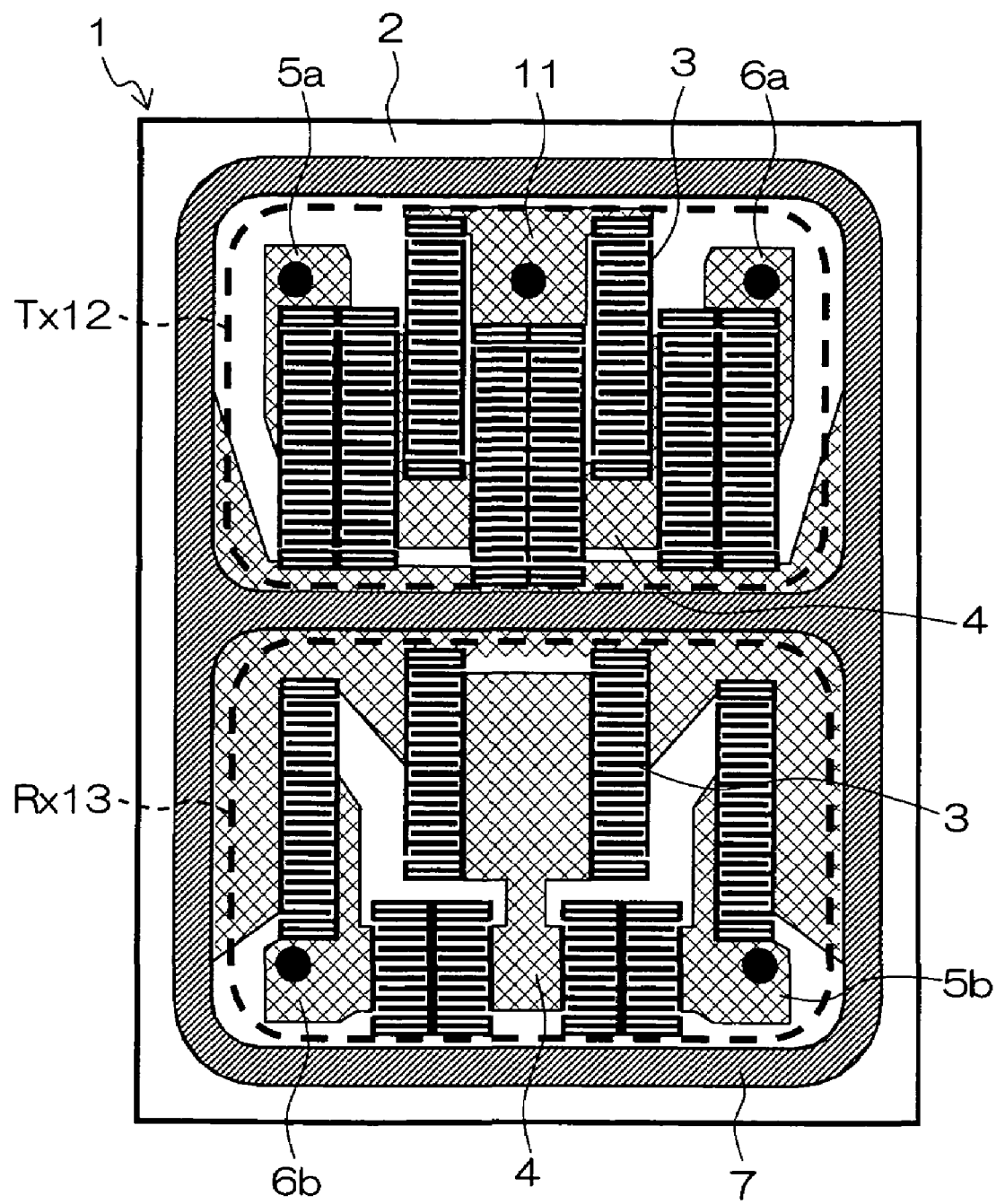
FIG. 4 is a plan view showing the main surface of a SAW-DPX manufactured according to the invention.

FIG. 4 is a plan view showing the main surface of another type surface acoustic wave element manufactured according to the invention.

This surface acoustic wave element is an example of a duplexer constructed by using two ladder-type surface acoustic wave elements. Two filter regions are formed, and form a transmitting filter and a receiving filter, respectively.

As shown in FIG. 4, on the piezoelectric substrate 2, a transmitting side filter region 12 and a receiving side filter region 13 are formed. In the transmitting side filter region 12, a plurality of IDT electrodes 3 forming a resonator and connecting electrodes 4 connecting these, and an input electrode part 5a and an output electrode part 6a electrically connected to the IDT electrodes 3 for connecting the surface acoustic wave element 1 and a mounting substrate (not shown) are formed.

Likewise, in the receiving side filter region 13, a plurality of IDT electrodes 3 forming a resonator and connecting electrodes 4 connecting these, and an input electrode part 5b and an output electrode part 6b electrically connected to the IDT electrodes 3 for connecting the surface acoustic wave element 1 and the mounting substrate are formed.

An annular electrode 7 is formed so as to individually surround the transmitting side filter region 12 and the receiving side filter region 13. The annular electrode 7 is connected to a mounting substrate side annular conductor formed on the upper surface of the mounting substrate corresponding to the annular electrode by using solder or the like.

In this example, the annular electrode 7 is formed so as to individually surround the transmitting side filter region 12 and the receiving side filter region 13 in an integral manner, and serves as a ground electrode of the receiving side filter of the receiving side filter region 13, and has a role of separately sealing the transmitting side filter region 12 and the receiving side filter region 13 between the piezoelectric substrate 2 and the mounting substrate.

In this surface acoustic wave element 1, no conductor layer is formed on the other surface of the piezoelectric substrate 2, either. Thereby, the capacitive coupling between the input electrode part 5a of the transmitting side filter region 12 and the output electrode part 6b of the receiving side filter region 13 via a parasitic capacitance occurring between these and the conductor layer can be prevented, and therefore, the out-of-passband attenuation of the surface acoustic wave element 1 can be improved.

In this example, the transmitting side filter of the transmitting side filter region 12 is grounded by connecting the ground electrode 11 to a ground electrode of the mounting substrate by a solder bump or the like without interposing the annular electrode 7.

As in the case with the transmitting side filter, it is also possible that the receiving side filter is directly connected to the ground electrode of the mounting substrate without using the annular electrode 7 as a ground electrode. To the contrary, it is also possible that the annular electrode 7 is used as a ground electrode of the transmitting side filter, and a ground electrode is provided on the receiving side filter and directly connected to the ground electrode of the mounting substrate.

MANUFACTURING METHOD EXAMPLE 1

FIG. 1(*a*) through FIG. 1(*j*) are sectional views showing an example of a surface acoustic wave device manufacturing method of the invention per step.

As shown in FIG. 1(*a*), an electrode layer 14 is formed on the main surface of the piezoelectric substrate 2.

As shown in FIG. 1(*b*), a number of filter regions are formed each having IDT electrodes, an input electrode part, and an output electrode part by patterning the electrode layer 14 on the main surface of the piezoelectric substrate 2.

As shown in FIG. 1(*c*), a conductor layer 15 is formed on the other surface of the piezoelectric substrate 2.

The steps described above can be carried out in the order corresponding to FIG. 1(*a*), FIG. 1(*c*), and FIG. 1(*b*) or FIG. 1(*c*), FIG. 1(*a*), and FIG. 1(*b*) other than the described order.

Herein, as a piezoelectric substrate, lithium tantalate single crystals, lithium niobate single crystals, and lithium tetraborate single crystals, etc., can be used.

As the electrode layer 14 on the main surface, aluminum, an aluminum alloy, copper, a copper alloy, a gold alloy, tantalum, a tantalum alloy, a laminate of layers made of these materials, or a laminate of these materials and a layer made of titanium or chromium, etc., can be used. As a deposition method for the electrode layer 14, sputtering and electron beam evaporation can be used.

As a method for patterning the electrode layer 14, photolithography is applied after depositing the electrode layer 14 and then RIE (Reactive Ion Etching) or wet etching is carried out. Or, a desired pattern is opened by using photolithography after forming a photoresist on the main surface of the piezoelectric substrate 2 before depositing the electrode layer 14, the electrode layer 14 is deposited, and then a lift-off process is applied to remove the photoresist together with the electrode layer 14 formed at unnecessary portions.

As a material of the conductor layer 15 on the other surface of the piezoelectric substrate 2, aluminum or the like can be used. As a method for depositing this, sputtering or electron beam evaporation can be used.

Next, as shown in FIG. 1(*d*), a protective film 17 for protecting the IDT electrodes is formed. As a material of the protective film 17, silicon, silica, etc., can be used. As a deposition method, sputtering, CVD (Chemical Vapor Deposition), or electron beam evaporation, etc., can be used.

In this protective film forming step, when deposition is carried out by heating the piezoelectric substrate to obtain excellent film quality and adhesion, the surface of the piezoelectric substrate is exposed to plasmas even in the case where heating is not actively carried out, so that the piezoelectric substrate reaches 50 through 300° C., however, in this case, the conductor layer 15 on the other surface effectively functions to prevent pyroelectric break-down.

Next, as shown in FIG. 1(*e*), a new electrode layer is laminated on the input electrode part and the output electrode part to form an input electrode pad and an output electrode pad. The new electrode layer is for electrically and/or structurally connecting the surface acoustic wave element and the mounting substrate with high reliability. For example, when solder is used for connection, the new electrode layer secures wettability of the solder and prevents diffusion thereof, and when a gold bump is used for connection, the new electrode layer has a function for adjusting the hardness of the pads so as to enable adhesion by means of ultrasonic waves. As a material and a structure of such a new electrode layer, a laminate of chromium, nickel, and gold or a laminate of chromium, silver, and gold or a thick film of gold or aluminum can be used. As a deposition method, sputtering and electron beam evaporation can be used.

In this new electrode layer forming step also, when the piezoelectric substrate is heated during deposition in order to obtain excellent film quality and adhesion, or even when heating is not positively carried out, the surface of the piezoelectric substrate is exposed to plasmas, so that the temperature of the piezoelectric substrate may reach 50 to 300° C., however, even in this case, the conductor layer 15 on the other surface effectively functions to prevent pyroelectric break-down.

The patterns of the IDT electrodes, the input electrode part, and the output electrode part on the main surface of the piezoelectric substrate 2 manufactured in these steps are as shown in the plan views of, for example, FIG. 3 and FIG. 4. The protective film is not shown in FIG. 3 and FIG. 4.

Herein, as shown in FIG. 1(*f*), all the conductor layer 15 on the other surface of the piezoelectric substrate 2 is removed.

As a method for removing the conductor layer 15, it is possible that the main surface of the piezoelectric substrate 2 is protected by a photoresist or the like, and then the conductor layer 15 on the other surface is subjected to wet etching, RIE (Reactive Ion Etching), sand-blasting, CMP (Chemical Mechanical Polishing), grinding, etc.

When a method for removing the conductor layer 15 by etching by mainly using chemical action is used, all the conductor layer 15 on the other surface can be completely removed without major damages on the piezoelectric substrate 2.

In addition, when a method for removing the conductor layer 15 by etching, by mainly using physical action is used, the other surface of the piezoelectric substrate 2 can be made rougher than the original state at the same time as removing the conductor layer 15, and thereby, the bulk wave that has been propagated inside the piezoelectric substrate 2 from the IDT electrodes in the filter regions and reflected by the other surface of the piezoelectric substrate 2, coupled to other IDT electrodes of the filter regions, and has deteriorated the out-of-passband attenuation and isolation performance, can be scattered on the other surface of the piezoelectric substrate 2, whereby the out-of-passband attenuation and isolation performance can be further improved. Deterioration in out-of-passband attenuation and isolation performance due to propagation of this bulk wave is smaller than deterioration due to parasitic capacitance, however, to completely meet the severe demand for the out-of-passband attenuation, it is also preferable that this deterioration due to a bulk wave is also reduced.

Thereafter, the photoresist on the main surface of the piezoelectric substrate 2 are removed.

In these steps, each process can be applied to the piezoelectric substrate 2 with a plurality of surface acoustic wave elements formed thereon, so that the plurality of surface acoustic wave elements can be processed at once, and this is efficient.

Next, when manufacturing is carried out by a so-called multiple-elements forming method in which a number of filter regions are formed on one piezoelectric substrate 2 as described above, as shown in FIG. 1(*g*), a number of surface acoustic wave elements are obtained by separating the piezoelectric substrate 2 by filter region. As a separation method, for example, a dicing method using a dicing blade or a laser cutting method using laser machining can be used.

Figure 1A:
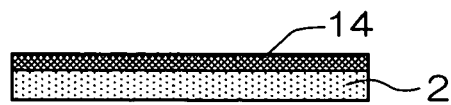
FIG. 1(a) through FIG. 1(j) are sectional views per step, showing an example of a surface acoustic wave device manufacturing method of the invention.
Figure 1B:
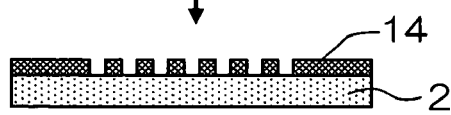
Figure 1C:
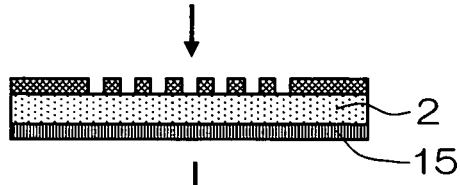
Figure 1D:
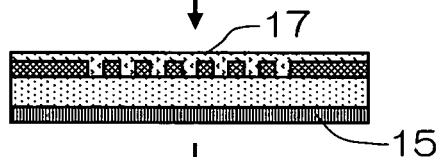
Figure 1E:
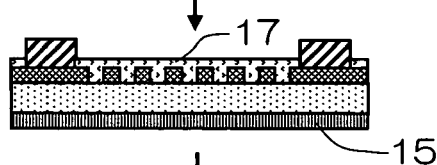
Figure 1F:
Figure 1G:
Figure 1H:
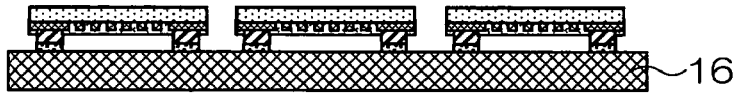

Next, as shown in FIG. 1(h), the surface acoustic wave elements are mounted on a mounting substrate 16 so as to make the main surfaces to face the mounting substrate.

Figure 1I:
Figure 1J:
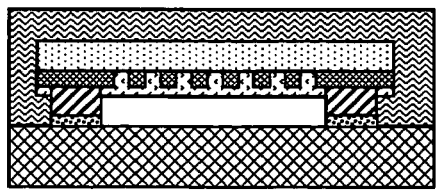

Then, as shown in FIG. 1(i), the surface acoustic wave elements mounted on the mounting substrate 16 are resin-molded by using a sealing resin, and then, as shown in FIG. 1(j), the mounting substrate 16 is cut together with the surface acoustic wave elements and the mold resin by dicing or the like to obtain surface acoustic wave devices of the invention.

In the above-mentioned embodiment, the step for removing all the conductor layer 15 on the other surface of the piezoelectric substrate 2 (FIG. 1(f)) is carried out before the separating step of FIG. 1(g), however, it may be carried out after the separating step of FIG. 1(g). In this case, the conductor layer 15 on the other surface effectively functions to prevent pyroelectric break-down caused due to a temperature rise applied to the piezoelectric substrate 2 by laser cutting during the separating step.

In addition, the removing step may be carried out after the mounting step of FIG. 1(h). Pyroelectric break-down may occur due to heat for fusing the solder in the mounting step, however, the conductor layer 15 on the other surface is effective for preventing pyroelectric break-down.

After the mounting step, since the main surface of the piezoelectric substrate 2 has already been disposed so as to face the mounting substrate 16, the step for protecting the main surface of the piezoelectric substrate 2 can be omitted. Particularly, when sealing is applied by using an annular electrode, the surface acoustic wave elements are firmly fixed to the mounting substrate 16, and the filter regions are shielded from the air, so that the conductor layer 15 on the other surface can be efficiently removed by using wet etching, RIE (reactive Ion Etching), or sand blasting, etc., as described above.

It is also possible that the conductor layer 15 on the other surface is removed by grinding or polishing by using a router or sandpaper.

In this example, the step for forming the protective film 17 (FIG. 1(d)) and the step for forming input and output electrode pads (FIG. 1(e)) are carried out during the manufacturing process, however, these steps are not necessarily carried out. In this case, to prevent removal of the conductor layer 15 immediately after forming it, the step for forming the conductor layer 15 is carried out before the step of FIG. 1(a) or FIG. 1(b), or the step for removing the conductor layer 15 on the other surface is carried out after the separating step of FIG. 1(g) or the mounting step of FIG. 1(h).

In addition, it is also allowed that other steps such as film thickness measurement, electric characteristics inspection, and annealing of the electrode layer, etc., on the main surface may be carried out.

MANUFACTURING METHOD EXAMPLE 2

Another manufacturing method example is shown in FIG. 2(a) through FIG. 2(j).

In the manufacturing method example 1, after the step for obtaining a number of surface acoustic wave elements by separating the piezoelectric substrate 2 having the number of surface acoustic wave elements formed thereon by filter regions, the surface acoustic wave elements are mounted on the mounting substrate 16 in the mounting step (FIG. 1(h)).

Figure 2A:
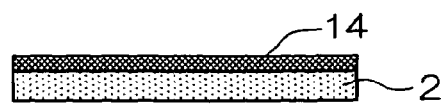
FIG. 2(a) through FIG. 2(j) are sectional views per step, showing an example of another surface acoustic wave device manufacturing method of the invention.
Figure 2B:
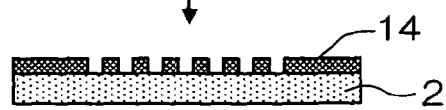
Figure 2C:
Figure 2D:
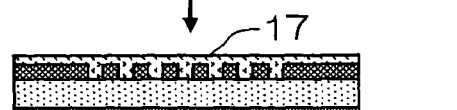
Figure 2E:
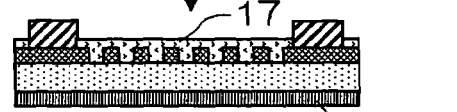
Figure 2F:
Figure 2G:

In this example, before separating the elements by filter region, in the mounting step of FIG. 2(f), the main surface of the piezoelectric substrate 2 on which a number of filter regions have been formed is attached onto the mounting substrate 16 so as to face the mounting substrate, and thereafter, as shown in FIG. 2(g), all the conductor layer 15 on the other surface of the piezoelectric substrate 2 is removed.

Figure 2H:
Figure 2I:
Figure 2J:

Then, as shown in FIG. 2(h), the piezoelectric substrate 2 integrated with the mounting substrate 16 is divided by filter region by so-called half dicing, and then, as shown in FIG. 2(i), the surface acoustic wave elements mounted on the mounting substrate 16 are resin-molded by using a sealing resin, and then, the mounting substrate 16 is separated by surface acoustic wave element together with the mold resin.

Thereby, by the presence of the conductor layer 15 on the other surface, pyroelectric break-down due to heat applied when the piezoelectric substrate 2 is exposed to plasmas can be prevented in the film forming step of FIG. 2(d) and the pad forming step of FIG. 2(e). Furthermore, pyroelectric break-down due to solder fusing heat applied in the mounting step of FIG. 2(f) can be prevented.

The step for removing the conductor layer 15 on the other surface of the piezoelectric substrate 2 can be carried out after half dicing of FIG. 2(h).

MANUFACTURING METHOD EXAMPLE 3

After all the conductor layer 15 on the other surface is removed, pyroelectric break-down easily occurs.

Figure 5:
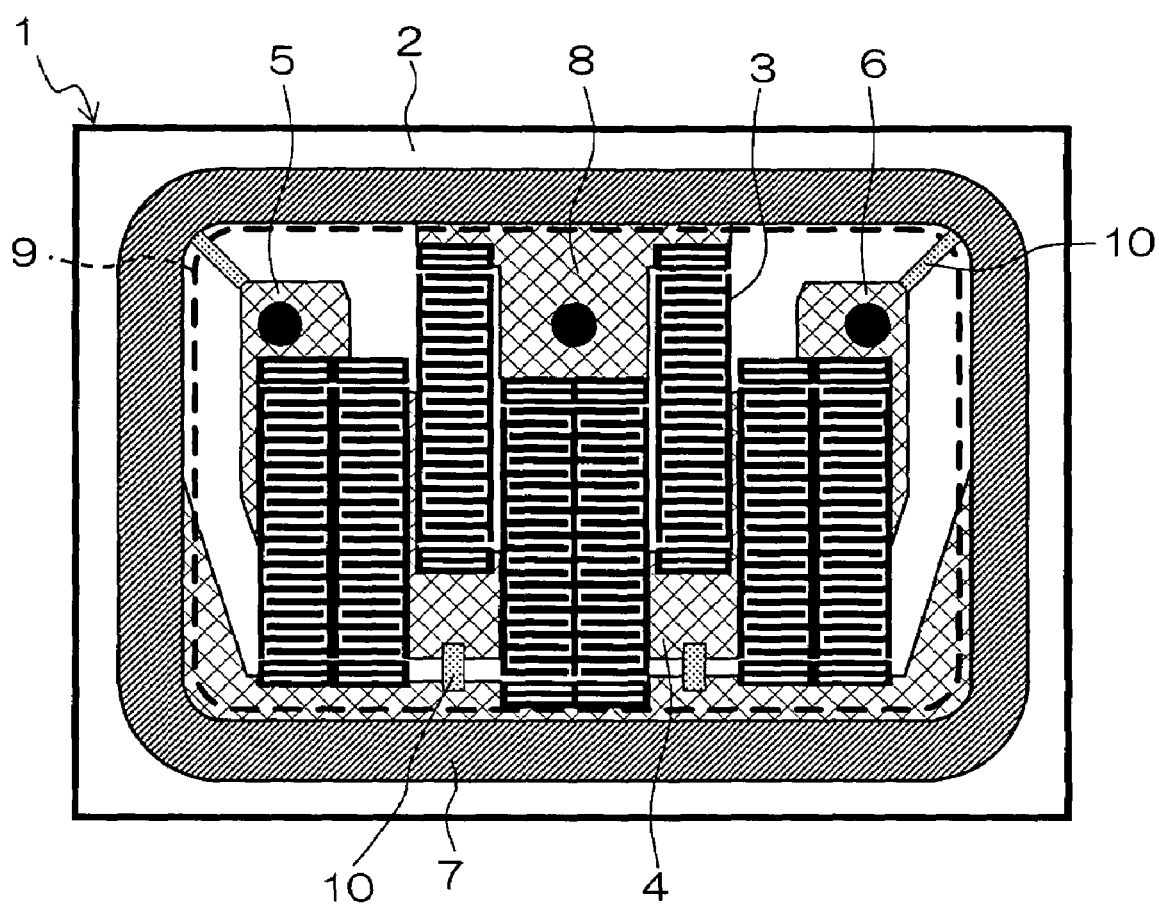
FIG. 5 is a plan view showing the main surface of a resistor-attached surface acoustic wave element manufactured according to the invention.
Figure 6:
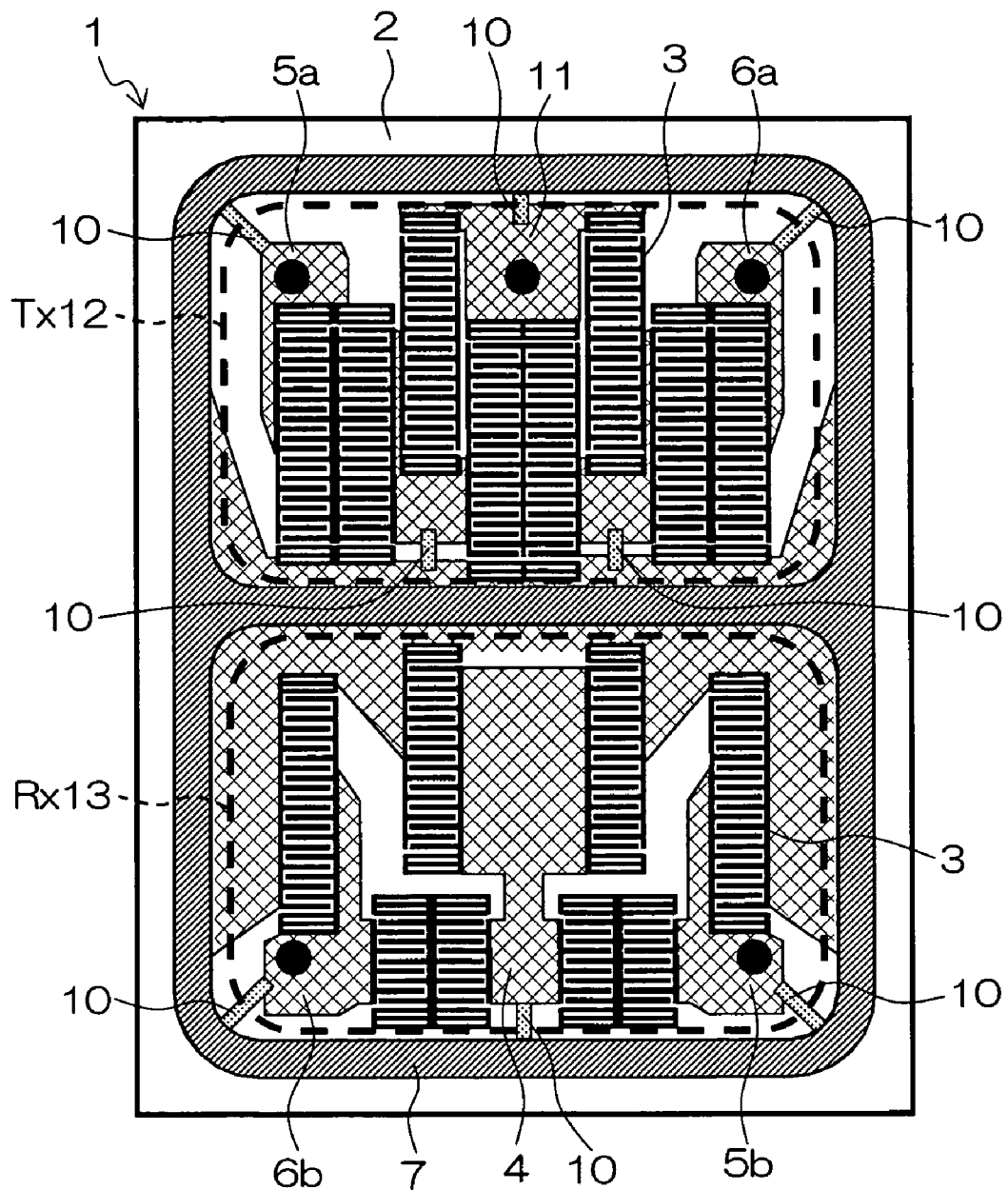
FIG. 6 is a plan view showing the main surface of a resistor-attached SAW-DPX manufactured according to the invention.

Therefore, in this example, as shown in FIG. 5 and FIG. 6, the IDT electrodes 3 and the annular electrode 7 are connected to each other via a resistor 10 so that a nonconductive state is made at high frequency and a conducting state is made with a direct current between the IDT electrodes 3 forming a resonator and the ground. Thereby, charges can be released from the main surface of the piezoelectric substrate 2 to the ground conductor of the mounting substrate, whereby making it difficult to cause pyroelectric break-down.

For this resistor 10, a material that is sufficiently high in resistance in a frequency band in that the surface acoustic wave element is used, and has a resistance that makes it look like an insulator is selected.

As a material of the resistor 10, a semiconductor of silicon or titanium oxide, etc., is preferably used. These materials can be controlled in resistance to a proper value by adding, when the material is silicon, a very small amount of an element such as boron, etc., or by adjusting, when the material is titanium oxide, the relative proportions.

The step for forming the pattern of the resistor 10 is preferably carried out after the IDT electrode patterning of FIG. 1(b) or before or after forming a new electrode layer on the input electrode part and output electrode part of FIG. 1(e). As a method for forming the resistor 10, sputtering, electron beam evaporation, and CVD can be used.

Instead of forming the resistor 10, the protective film itself can be formed as a semiconductor film.

Surface Acoustic Wave Device

A surface acoustic wave device of the invention is applicable to a communications equipment.

Namely, in a communications equipment having at least either one of a receiving circuit or a transmitting circuit, a surface acoustic wave device of the invention is used as a band-pass filter included in these circuits.

For example, the invention can be applied to a communications equipment having a transmitting circuit, which gets a transmission signal, mixing the signal on a carrier frequency by a mixer, attenuates unnecessary signals by a band-pass filter, amplifies the transmission signal by a power amplifier and then transmits the transmission signal from an antenna through a duplexer. In addition, the invention can be applied to a communications equipment having a receiving circuit which receives a signal by an antenna, passes the received signal through a duplexer and amplifies the received signal by a low-noise amplifier, and then attenuates unnecessary signals by a band-pass filter, separates a signal from the carrier frequency by a mixer for extracting this signal.

By using the surface acoustic wave device of the invention in either one of the receiving circuit and the transmitting circuit, a communications equipment of the invention with improved excellent transmission performance is provided.

Figure 7A:
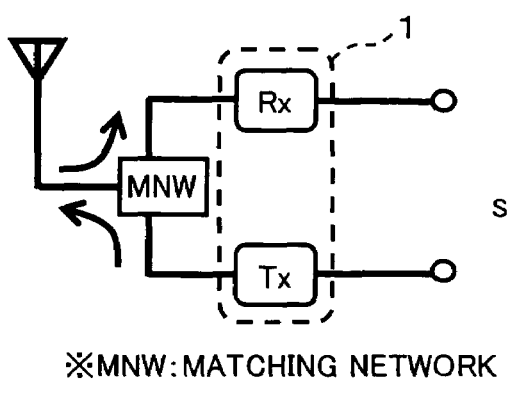
FIG. 7(a) is a circuit diagram of a communications equipment when no parasitic capacitance is present.
Figure 7B:
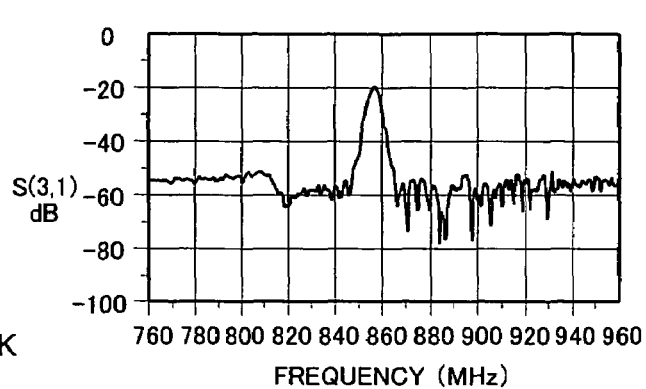
FIG. 7(b) is a diagram showing an example of isolation performance.
Figure 7C:
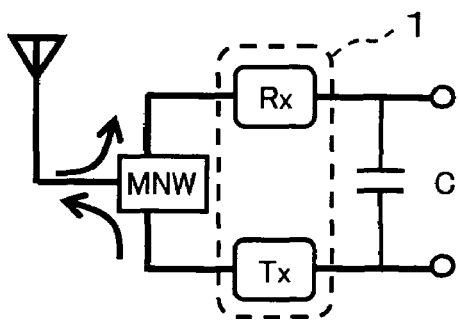
FIG. 7(c) is a circuit diagram of a communications equipment and a diagram showing an example of isolation performance when the parasitic capacitance C is present due to the back face conductor.
Figure 7D:
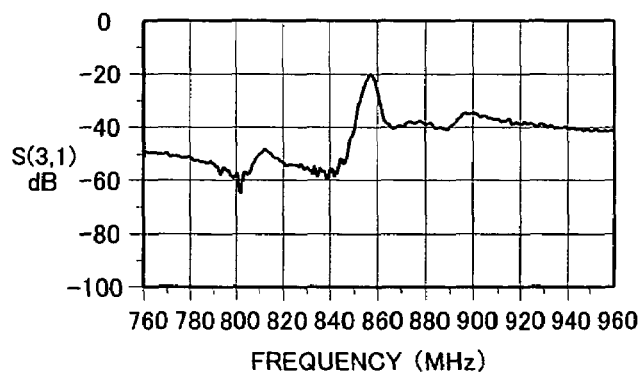
FIG. 7(d) is a diagram showing an example of isolation performance.

In addition, the duplexer formed by the surface acoustic wave device of the invention is also applicable to a SAW-DPX at the front end of a communications equipment as seen in the circuit diagram of FIG. 7(a).

Figure 8:
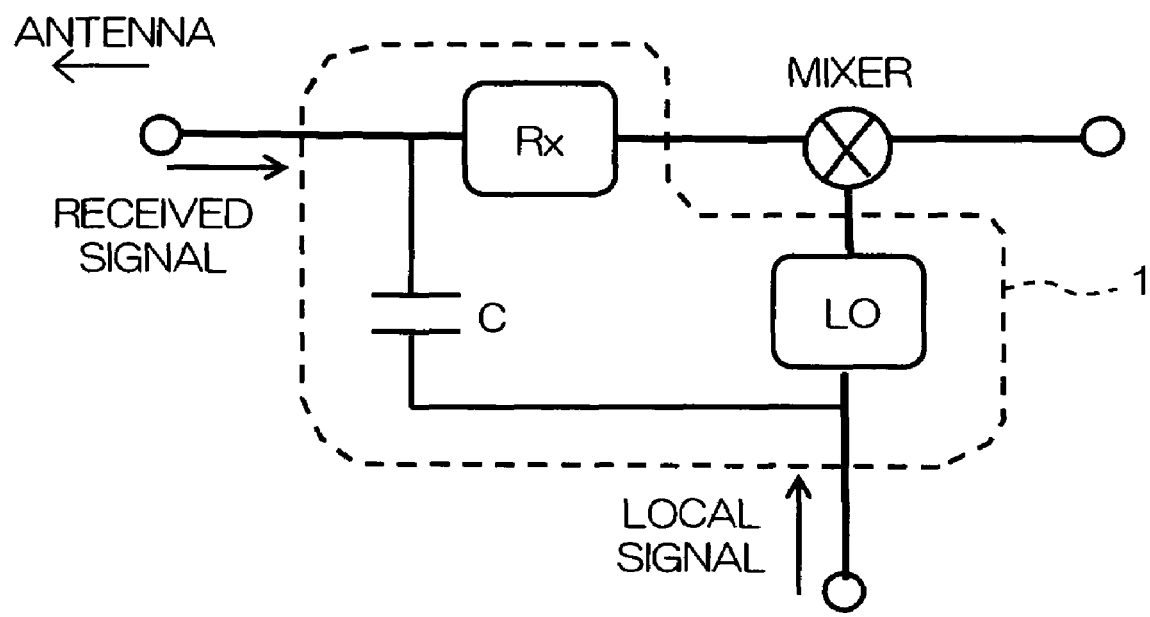
FIG. 8 is a circuit diagram showing an example in which the surface acoustic wave device 1 of the invention is applied to a duplexer having an interstage receiving side filter and a filter having performance for transmitting a frequency band of a local signal, integrated together.

In addition, as shown in the circuit diagram of FIG. 8, the invention is also applicable to a duplexer in which a receiving side filter that prevents a local signal for a mixer from leaking to the antenna side when converting a received signal into an intermediate frequency and transmits only the received signal, and a filter having characteristics for transmitting a frequency band of the local signal, are integrated together.

FIG. 8 is a circuit diagram showing the construction around the mixer of the communications equipment, which simultaneously shows a parasitic capacitance occurring when the conductor layer on the other surface of the piezoelectric substrate is not removed.

The invention is not limited to the above-mentioned manufacturing method examples, and without deviating from the spirit of the invention, there is no problem with adding various alternations.

For example, in FIG. 3 and FIG. 4, etc., the ladder-type filter is used, however, the invention is not intended to limit the filter structure, and DMS type and IIDT type filters can be used.

In addition, the IDT electrode material is not limited to the materials listed in the embodiment, and it is also possible that a single layer of Al, Au, Ta, W, Mo, Ti, Cu, and alloys of these are used, and an adhesive layer is inserted between these and the piezoelectric substrate.

In addition, in FIG. 4, the low frequency side filter is used as a transmitting side filter and the high frequency side filter is used as a receiving side filter, however, it is also possible that the low frequency side filter is used as a receiving side filter and the high frequency side filter is used as a transmitting side filter.

In addition, two or more sets of duplexers can be provided on the same piezoelectric substrate, and furthermore, other filters that have no influence on the isolation performance of the duplexer can be provided on the same piezoelectric substrate. In this case, the total area occupied by the surface acoustic wave elements can be made smaller than in the case where the plurality of surface acoustic wave elements are separately formed.

In addition, even when the elements manufactured by a so-called wafer level packaging (hereinafter, abbreviated to WLP) technique in which a structure that secures and seals a vibration space is formed on the surface of the piezoelectric substrate are directly flip-chip mounted on a PCB (Printed Circuit Board) of a portable communications equipment or the like, introduction of the step for removing the back face conductor layer of the piezoelectric substrate of the invention is effective. In this case, the PCB corresponds to a mounting substrate.

Figure 12:
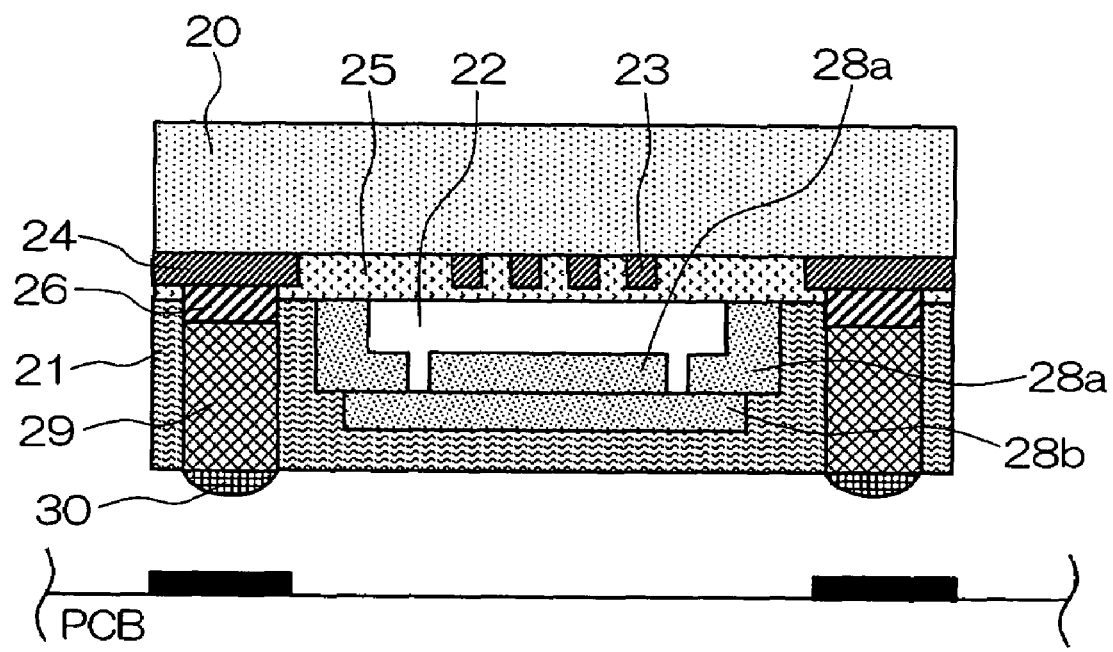
FIG. 12 is a sectional view showing an example of a surface acoustic wave element manufactured by using the WLP (Wafer Level Packaging) technique.
Figure 13:
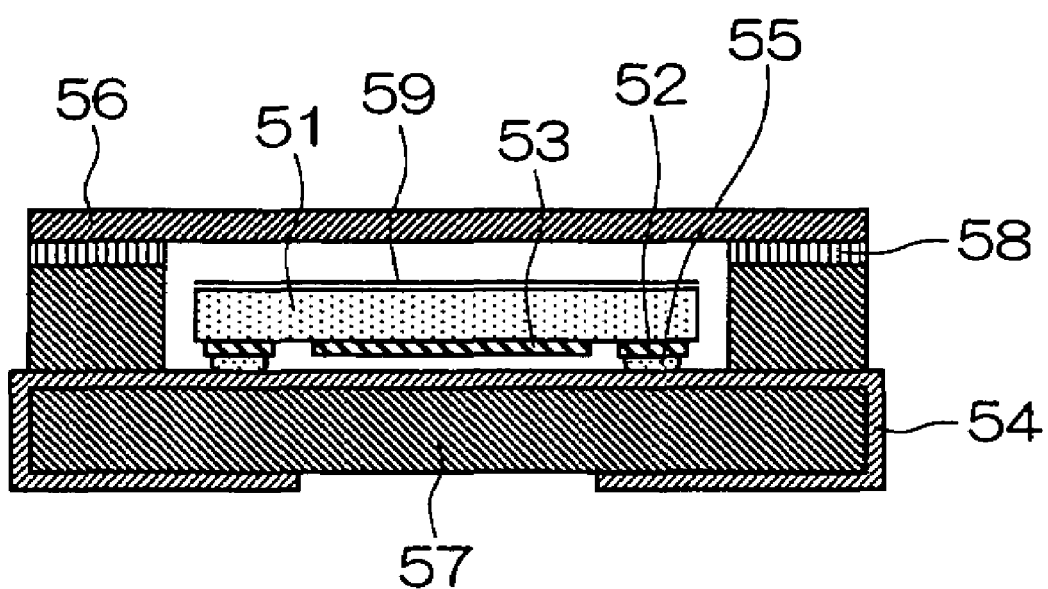
FIG. 13 is a sectional view schematically showing a mounting structure of a conventional surface acoustic wave device.

An example of a surface acoustic wave element manufactured by the WLP technique is shown in FIG. 12. On the main surface of the piezoelectric substrate 20, IDT electrodes 23, input and output electrodes 24, etc., are formed, and a vibration space 22 is secured by cavity structures 28a and 28b. On the input and output electrodes 24, pad electrodes 26 are formed which serve as plating seed layers. Post electrodes 29 are formed by plating. Terminal electrodes 30, a protective film 25, and sheath resins 21 may be formed as appropriate. Such a surface acoustic wave element realizes a very small-sized surface acoustic wave device.

Example 1

A surface acoustic wave device was manufactured by the method shown in FIG. 1(a) through FIG. 1(j).

On the main surface of a piezoelectric substrate 2 (substrate thickness: 250 micrometers) formed of a 38.7°-Y-cut X propagating lithium tantalate single crystal substrate, a four-layer laminated electrode layer of, in order from the substrate side, Ti, Al-1% by mass Cu, Ti, and Al-1% by mass Cu were formed by sputtering. The film thicknesses are 6 nanometers, 209 nanometers, 6 nanometers, and 209 nanometers, respectively.

Next, as shown in FIG. 3, the electrode layer was patterned by photolithography and RIE to form a number of filter regions each having IDT electrodes 3, an input electrode part 5, and an output electrode part 6. At the same time, the ground electrode part 8, the connecting electrode 4, and the annular electrode 7 were also formed.

As an etching gas in this case, a BCl3 and Cl2 mixed gas was used. Both the line width of the comb-shaped electrodes forming the IDT electrodes 3 and the interval between adjacent comb-shaped electrodes are approximately 1 micrometer.

Next, on the other surface of the piezoelectric substrate 2, a conductor layer made of pure Al was formed by sputtering. The thickness of this conductor layer is 200 nanometers.

Next, a protective film made of silica was formed on the main surface of the piezoelectric substrate 2 by plasma CVD. The film forming temperature is 300° C., and the film thickness is 20 nanometers.

Next, the protective film is partially removed by photolithography and RIE, a new electrode layer of Cr, Ni, and Au was laminated on the input electrode part 5, the output electrode part 6, and the ground electrode part 8 to form an input electrode pad, an output electrode pad, and a ground electrode pad. On the annular electrode 7, an electrode layer with the same structure was also formed. The thicknesses of the layers of the new electrode layer are 6 nanometers, 1000 nanometers, and 100 nanometers, respectively.

Next, the main surface of the piezoelectric substrate 2 is protected by a photoresist, and thereafter, all the conductor layer on the other surface of the piezoelectric substrate 2 was removed by wet etching using a mixed acid of nitric acid, phosphoric acid, and acetic acid.

Next, after removing the photoresist, the piezoelectric substrate 2 was separated by filter region by dicing to obtain a number of surface acoustic wave elements 1.

Next, the surface acoustic wave elements 1 were mounted on a mounting substrate made of an LTCC (Low Temperature Co-fired Ceramics) so that the main surface thereof faces the mounting substrate.

Herein, the LTCC substrate has a mounting substrate side annular conductor corresponding to the annular electrode 7 formed on the main surface of the piezoelectric substrate 2 and pad electrodes to be connected to the input and output electrode pads and the ground electrode pad of the surface acoustic wave element 1, and solder was printed in advance on these mounting substrate side annular conductor and the pad electrodes.

When mounting the surface acoustic wave elements 1 on the mounting substrate, the surface acoustic wave element 1 was disposed so as to match the solder patterns and temporarily fixed by being applied with ultrasonic waves, and then the solder was fused by heating to connect the annular electrode 7 to the mounting substrate side annular conductor and the input and output electrode pads and the ground electrode pad to the pad electrodes.

Thereby, the filter region 9 of the surface acoustic wave element 1 was completely sealed airtight by the mounting substrate side annular conductor of the LTCC substrate and the annular electrode 7 connected thereto. The step for mounting the surface acoustic wave element 1 was carried out in the atmosphere of nitrogen.

Next, resin molding was carried out and the other surfaces of the surface acoustic wave elements 1 were protected by the molding resin, and last, the mounting substrate was diced between the surface acoustic wave elements, whereby a surface acoustic wave device of the invention was obtained.

As a comparative example, in the conventional way, a surface acoustic wave device was manufactured by mounting a surface acoustic wave element that included filter regions each having IDT electrodes, an input electrode part, and an output electrode part, formed on the main surface of the piezoelectric substrate, and a conductor layer formed on the entire surface of the other surface, on a mounting substrate by making the main surface face the mounting substrate. The plan view of this comparative example is similar to FIG. 3.

The frequency characteristics of the example of the invention and the comparative example, manufactured as described above, were measured.

Figure 9:
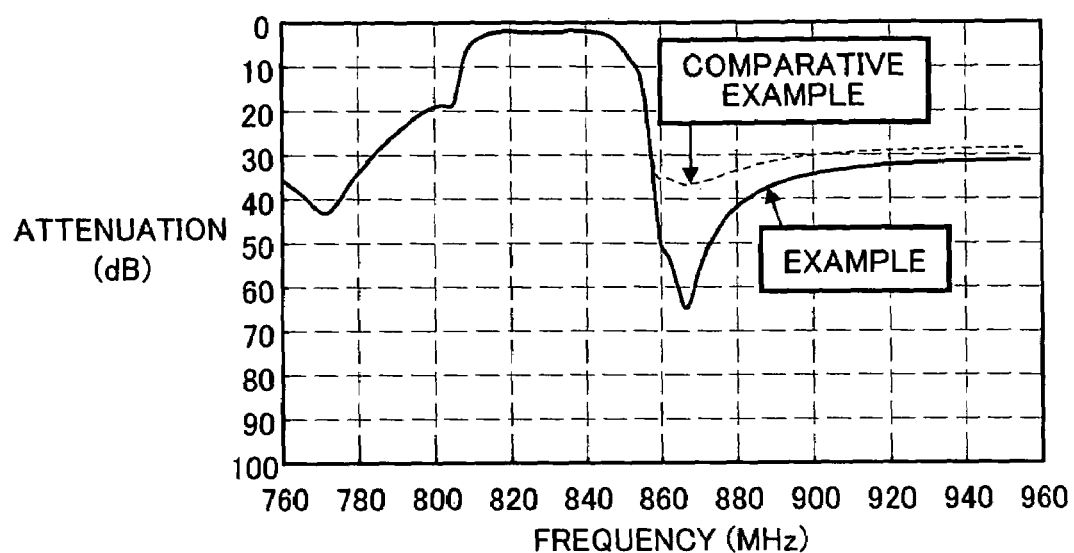
FIG. 9 is a diagram showing bandpass characteristics of the surface acoustic wave device manufactured according to the invention.

The frequency characteristics are shown in the diagram of FIG. 9. In the diagram of FIG. 9, the horizontal axis indicates a frequency (unit: MHz), and the vertical axis indicates attenuation (unit: dB).

The dashed characteristic curve indicates the results of the comparative example in which a conductor layer is formed on the entire surface of the other surface of the piezoelectric substrate, and the solid characteristic curve indicates the results of the example in which all the conductor layer on the other surface of the piezoelectric substrate is removed.

As understood from the results shown in FIG. 9, the surface acoustic wave device of this example of the invention has very excellent out-of-passband attenuation in comparison with that of the comparative example. Particularly, in comparison with the comparative example, the out-of-passband attenuation near the passband is remarkably improved.

As in the case of this example, the frequency characteristics of elements manufactured through the steps of FIG. 2(a) through FIG. 2(j) were also evaluated, and it was also confirmed that the out-of-passband attenuation near the passband was remarkably improved.

Example 2

A duplexer type surface acoustic wave device having a transmitting side filter region and a receiving side filter region on a piezoelectric substrate was manufactured by the method of FIG. 1(a) through FIG. 1(j).

Example 2-1

A four-layer laminated electrode layer was formed on the main surface of a piezoelectric substrate formed of a lithium tantalate single crystal substrate in the same manner as Example 1.

Next, this laminated electrode layer was patterned by photolithography and RIE to form a number of filter regions that included transmitting side filter regions and receiving side filter regions each having IDT electrodes 3, an input electrode part 5, and an output electrode part 6. Simultaneously, a ground electrode part 11, a connecting electrode 4, and an annular electrode 7 were also formed.

As an etching gas in this case, a BC13 and C12 mixed gas was used.

The line width of the comb tooth forming the IDT electrodes 3 and the distance between the adjacent comb teeth are both approximately 1 micrometer.

Next, a conductor layer made of pure Al was formed on the other surface of the piezoelectric substrate by sputtering. The thickness of this conductor layer is 200 nanometers.

Next, a protective film made of silica was formed on the main surface of the piezoelectric substrate by plasma CVD. This film forming temperature is 300° C. and the film thickness is 20 nanometers.

Next, the protective film was partially removed by photolithography and RIE, and on the input electrode part 5, the output electrode part 6, and the ground electrode part 11, a new electrode layer made of Cr/Ni/Au was laminated to form an input electrode pad and an output electrode pad. Furthermore, an electrode layer with the same structure was also formed on the annular electrode 7. The thicknesses of the layers of the new electrode are 6 nanometers, 1000 nanometers, and 100 nanometers, respectively.

Next, the main surface of the piezoelectric substrate is protected by a photoresist, and then all the conductor layer on the other surface of the piezoelectric substrate was removed by wet etching using a mixed acid of nitric acid, phosphoric acid, and acetic acid.

Next, the photoresist was removed, and then the piezoelectric substrate was separated between filter regions by means of dicing to obtain a number of surface acoustic wave elements.

Next, the surface acoustic wave elements were mounted on a mounting substrate formed of anLTCC (Low Temperature Co-fired Ceramics) substrate so that the main surface faces the mounting substrate. This mounting method is the same as in Example 1.

Next, resin molding was carried out and the other surfaces of the surface acoustic wave elements were protected by the molding resin, and last, the mounting substrate was diced between the surface acoustic wave elements, whereby a surface acoustic wave device of the invention was obtained.

In the surface acoustic wave device of the invention thus manufactured, an RF signal was applied to the input terminal of the transmitting side filter, and a signal from the output terminal of the receiving side filter was measured to measure the isolation performance (measurement was made without installing a matching network that would be inserted between the transmitting side filter and the receiving side filter in normal use as a duplexer).

Figure 10:
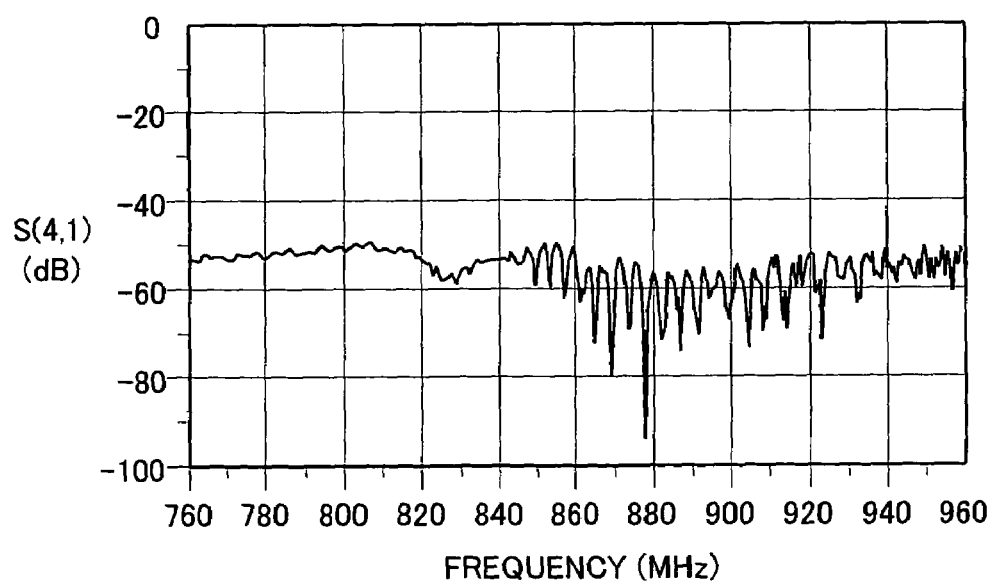
FIG. 10 is a diagram showing isolation performance of the surface acoustic wave device of the invention manufactured according to the surface acoustic wave device manufacturing method of the invention.

FIG. 10 is a diagram showing the isolation performance. It is understood from FIG. 10 that the surface acoustic wave device of this example of the invention has very excellent isolation performance.

Example 2-2

As in the case of Example 1, a four-layer laminated electrode layer was formed on the main surface of the piezoelectric substrate formed of a lithium tantalate single crystal substrate.

Next, a conductor layer made of pure Al was formed on the other surface of the piezoelectric substrate by sputtering. The thickness of the conductor layer is 200 nanometers.

Next, the conductor layer on the main surface of the piezoelectric substrate was patterned by photolithography and RIE to form a number of filter regions that include transmitting side filter regions and receiving side filter regions each having IDT electrodes, an input electrode part 5, and an output electrode part 6. Simultaneously, the ground electrode part 11, the connecting electrode 4, and the annular electrode 7 were also formed.

As an etching gas for RIE, BC13 and C12 were used. The line width of the comb tooth of the IDT electrodes and the distance between the adjacent comb teeth are both 1 micrometer.

Next, a protective film made of silica was formed on the main surface of the piezoelectric substrate by plasma CVD. The film forming temperature is 300° C. and the film thickness is 20 nanometers.

Next, the protective film was partially removed by photolithography and RIE, and at the removed portions, resistors made of silicon doped with a very small amount of boron were formed by sputtering, and the IDT electrodes were connected to the annular electrode via the resistors.

Next, the protective film was partially removed by photolithography and RIE, and a new electrode layer made of Cr/Ni/Au was laminated on the input electrode part 5, the output electrode part 6, and the ground electrode part 11 to form an input electrode pad and an output electrode pad. An electrode layer with the same structure was also formed on the annular electrode 7. The thicknesses of the layers of the new electrode layer are 6 nanometers, 1000 nanometers, and 100 nanometers.

Next, the main surface of the piezoelectric substrate was protected by a photoresist, and thereafter, all the conductor layer on the other surface of the piezoelectric substrate corresponding to the filter regions was removed by wet etching using a mixed acid of nitric acid, phosphoric acid, and acetic acid.

Next, after removing the photoresist, the piezoelectric substrate was diced and separated by filter region to obtain a number of surface acoustic wave elements. The mounting step after this is the same as in Example 1.

In this Example 2, break-down due to spark did not occur since the IDT electrodes were DC-connected to the ground potential by the resistors although break-down due to spark had sometimes occurred during the mounting step of Example 1.

Example 2-3

Wet etching was used in the step for removing the conductor layer on the other surface in Examples 2-1 and 2-2, however, in this example, mechanical polishing using sandpaper was used.

The surface acoustic wave element manufacturing process is the same as in the above-mentioned examples, however, the conductor layer on the other surface was removed after the surface acoustic wave elements were mounted on an LTCC substrate as a mounting substrate.

Figure 11A:
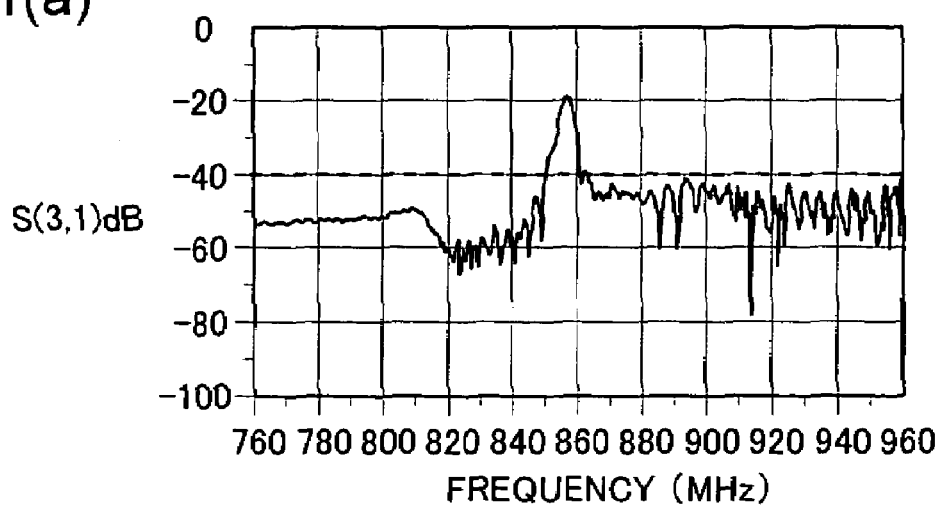
FIG. 11(a) through FIG. 11(c) are diagrams showing isolation performance of the surface acoustic wave device in which a conductor layer on the other surface has been mechanically removed.
Figure 11B:
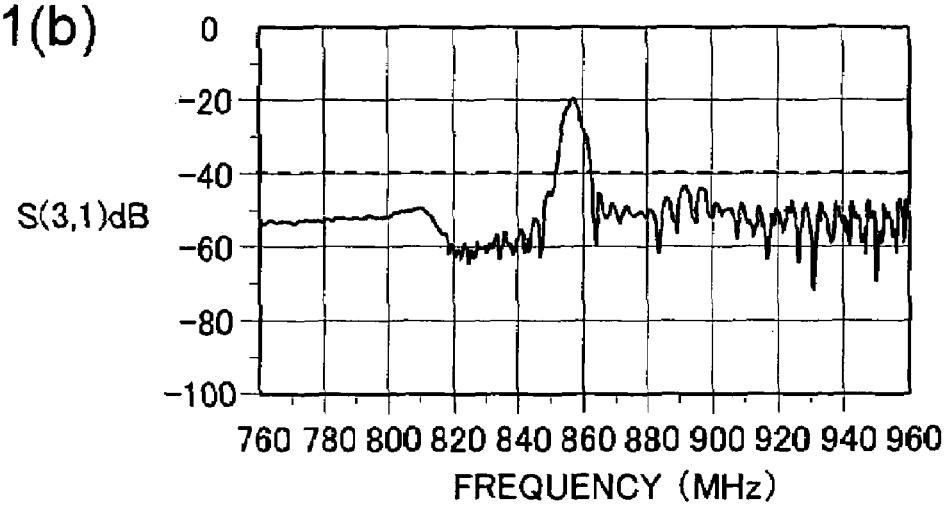
Figure 11C:
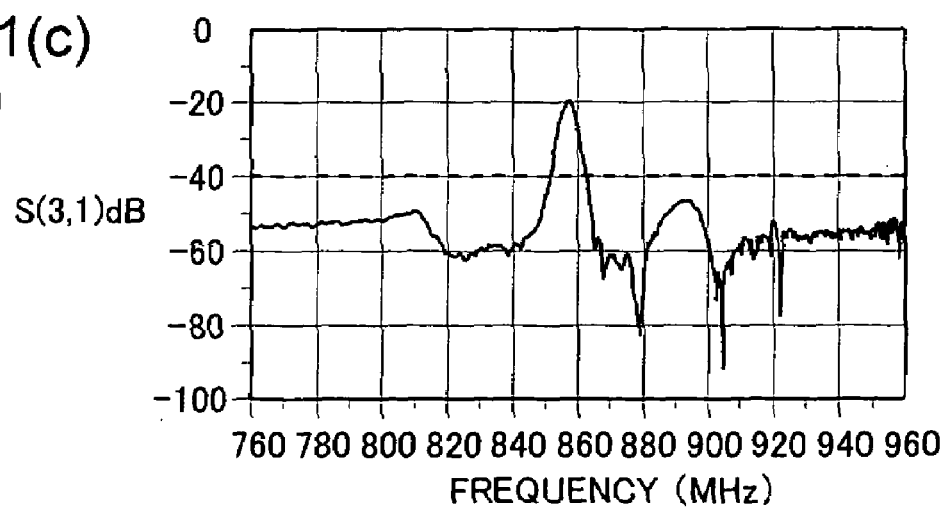

Concerning the surface acoustic wave device thus manufactured, isolation performance changes according to roughness of each used sandpaper are shown in the diagrams of FIG. 11(*a*) through FIG. 11(*c*). This measurement of isolation performance was made in the state of the circuit in that a matching network MNW was inserted as shown in FIG. 7(*a*).

As understood from the results shown in FIG. 11(*a*) through FIG. 11(*c*), the rougher the sandpaper, the better the isolation performance, and it is proved that when #220 is used, the isolation performance is very significantly improved.

In addition, since the surface roughness of the other surface of the piezoelectric substrate increases as the roughness of the sandpaper increases, it is understood that the fine ripples due to the bulk wave found on the waveform of the isolation performance become small.

The disclosure of Japanese patent application Serial Nos. 2004-190564 filed on Jun. 28, 2004 and 2004-268257 filed on Sep. 15, 2004 are incorporated herein by reference.

What is claimed is:

1. A surface acoustic wave device manufacturing method comprising:
    an electrode layer forming step for forming an electrode layer on a main surface of a piezoelectric substrate;
    an electrode patterning step for forming filter regions each having IDT electrodes, an input electrode part, and an output electrode part by patterning the electrode layer on the main surface;
    a separating step for separating the piezoelectric substrate to obtain a number of surface acoustic wave elements;
    a mounting step for mounting the surface acoustic wave elements on a mounting substrate so that the main surface of the piezoelectric substrate faces the mounting substrate;
    a conductor layer forming step for forming a conductor layer on a generally entirety of the other surface of the piezoelectric substrate (i) before the electrode layer forming step, (ii) between the electrode layer forming step and the electrode patterning step, or (iii) between the electrode patterning step and the separating step; and
    a conductor layer removing step for removing the conductor layer formed on the other surface before the separating step.

2. The surface acoustic wave device manufacturing method according to claim 1, further comprising: a protective film forming step and an electrode pad forming step, provided after the electrode patterning step and before the separating step.

3. A surface acoustic wave device manufacturing method according to claim 1, further comprising:
    a step for forming an annular electrode that surrounds the filter regions on the main surface, wherein
    in the mounting step the annular electrode is joined to a mounting substrate side annular conductor formed on the mounting substrate.

4. The surface acoustic wave device manufacturing method according to claim 3, further comprising:
    a step for forming resistors on the main surface, wherein
    the IDT electrodes are electrically connected to the annular electrode via the resistors, and
    the annular electrode is at a ground potential.

5. The surface acoustic wave device manufacturing method according to claim 1, wherein the filter regions formed in the electrode patterning step include transmitting side filter region and receiving side filter region.

6. The surface acoustic wave device manufacturing method according to claim 5, further comprising a step for forming an annular electrode that surrounds the transmitting side filter region and the receiving side filter region on the main surface, wherein in the mounting step, the annular electrode is joined to a mounting substrate side annular conductor formed on the mounting substrate.

7. A surface acoustic wave device manufacturing method comprising:
- an electrode layer forming step for forming an electrode layer on a main surface of a piezoelectric substrate;
- an electrode patterning step for forming filter regions each having IDT electrodes, an input electrode part, and an output electrode part by patterning the electrode layer on the main surface;
- a separating step for separating the piezoelectric substrate to obtain a number of surface acoustic wave elements;
- a mounting step for mounting the surface acoustic wave elements on a mounting substrate so that the main surface of the piezoelectric substrate faces the mounting substrate;
- a conductor layer forming step for forming a conductor layer on a generally entirety of the other surface of the piezoelectric substrate (i) before the electrode layer forming step, (ii) between the electrode layer forming step and the electrode patterning step, or (iii) between the electrode patterning step and the separating step; and
- a conductor layer removing step for removing the conductor layer formed on the other surface after performing the mounting step.

8. The surface acoustic wave device manufacturing method according to claim 7, further comprising:
- a protective film forming step and an electrode pad forming step, provided after the electrode patterning step and before the separating step.

9. A surface acoustic wave device manufacturing method comprising:
- an electrode layer forming step for forming an electrode layer on a main surface of a piezoelectric substrate;
- an electrode patterning step for forming filter regions for surface acoustic wave elements each having IDT electrodes, an input electrode part, and an output electrode part by patterning the electrode layer on the main surface;
- a mounting step for mounting the surface acoustic wave elements on a mounting substrate so that the main surface of the piezoelectric substrate faces the mounting substrate;
- a separating step for separating the piezoelectric substrate and the mounting substrate to obtain a number of surface acoustic wave elements mounted on the mounting substrate;
- a conductor layer forming step for forming a conductor layer on a generally entirety of the other surface of the piezoelectric substrate (i) before the electrode layer forming step, (ii) between the electrode layer forming step and the electrode patterning step, or (iii) between the electrode patterning step and the mounting step; and
- a conductor layer removing step for removing the conductor layer formed on the other surface before performing the mounting step.

10. The surface acoustic wave device manufacturing method according to claim 9, further comprising:
- a protective film forming step and an electrode pad forming step, provided after the electrode patterning step and before the mounting step.

11. A surface acoustic wave device manufacturing method comprising:
- an electrode layer forming step for forming an electrode layer on a main surface of a piezoelectric substrate;
- an electrode patterning step for forming filter regions for surface acoustic wave elements each having IDT electrodes, an input electrode part, and an output electrode part by patterning the electrode layer on the main surface;
- a mounting step for mounting the surface acoustic wave elements on a mounting substrate so that the main surface of the piezoelectric substrate faces the mounting substrate;
- a separating step for separating the piezoelectric substrate and the mounting substrate to obtain a number of surface acoustic wave elements mounted on the mounting substrate;
- a conductor layer forming step for forming a conductor layer on a generally entirety of the other surface of the piezoelectric substrate (i) before the electrode layer forming step, (ii) between the electrode layer forming step and the electrode patterning step, or (iii) between the electrode patterning step and the mounting step; and
- a conductor layer removing step for removing the conductor layer formed on the other surface after performing the mounting step and before performing the separating step.

12. The surface acoustic wave device manufacturing method according to claim 11, further comprising:
- a protective film forming step and an electrode pad forming step, provided after the electrode patterning step and before the mounting step.

13. A surface acoustic wave device manufacturing method comprising:
- an electrode layer forming step for forming an electrode layer on a main surface of a pie zoelectric substrate;
- an electrode patterning step for forming filter regions for surface acoustic wave elements each having IDT electrodes, an input electrode part, and an output electrode part by patterning the electrode layer on the main surface;
- a mounting step for mounting the surface acoustic wave elements on a mounting substrate so that the main surface of the piezoelectric substrate faces the mounting substrate;
- a separating step for separating the piezoelectric substrate and the mounting substrate to obtain a number of surface acoustic wave elements mounted on the mounting substrate;
- a conductor layer forming step for forming a conductor layer on a generally entirety of the other surface of the piezoelectric substrate (i) before the electrode layer forming step, (ii) between the electrode layer forming step and the electrode patterning step, or (iii) between the electrode patterning step and the mounting step; and
- a conductor layer removing step for removing the conductor layer formed on the other surface after performing the separating step.

14. The surface acoustic wave device manufacturing method according to claim 13, further comprising:
- a protective film forming step and an electrode pad forming step, provided after the electrode patterning step and before the mounting step.

15. A surface acoustic wave device manufacturing method comprising:
- an electrode layer forming step for forming an electrode layer on a main surface of a piezoelectric substrate;
- an electrode patterning step for forming filter regions for surface acoustic wave elements each having IDT electrodes, an input electrode part, and an output electrode part by patterning the electrode layer on the main surface; and a step for carrying out either one step first and the other step later out of a separating step for separating the piezoelectric substrate to obtain a number of surface acoustic wave elements and a mounting step for mounting the surface acoustic wave elements on a mounting substrate so that the main surface of the piezoelectric substrate faces the mounting substrate, wherein a conductor layer forming step for forming a conductor layer on the other surface of the piezoelectric substrate is provided (i) before the electrode layer forming step, (ii) between the electrode layer forming step and the electrode patterning step, or (iii) between the electrode patterning step and the separating step or the mounting step, a conductor layer removing step for removing the conductor layer formed on the other surface is provided after performing at least one step after the conductor layer forming step, and a protective film forming step and an electrode pad forming step are provided (i) after the electrode patterning step and before the separating step, or (ii) after the electrode patterning step and before the mounting step.

16. The surface acoustic wave device manufacturing method according to claim 15, wherein
the at least one step is either
(e) the protective film forming step or
(f) the electrode pad forming step.

* * * * *